United States Patent
Koshizawa et al.

(10) Patent No.: US 10,954,129 B2
(45) Date of Patent: Mar. 23, 2021

(54) DIAMOND-LIKE CARBON AS MANDREL

(71) Applicant: Applied Materials, Inc., Santa Clara, CA (US)

(72) Inventors: Takehito Koshizawa, San Jose, CA (US); Eswaranand Venkatasubramanian, Santa Clara, CA (US); Pramit Manna, Sunnyvale, CA (US); Chi Lu, Sunnyvale, CA (US); Chi-I Lang, Cupertino, CA (US); Nancy Fung, Livermore, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/002,218

(22) Filed: Jun. 7, 2018

(65) Prior Publication Data
US 2018/0358229 A1   Dec. 13, 2018

Related U.S. Application Data

(60) Provisional application No. 62/546,266, filed on Aug. 16, 2017, provisional application No. 62/516,828, filed on Jun. 8, 2017.

(51) Int. Cl.
| | |
|---|---|
| *H01L 21/02* | (2006.01) |
| *C01B 32/28* | (2017.01) |
| *H01L 21/308* | (2006.01) |
| *C01B 32/26* | (2017.01) |
| *H01L 21/311* | (2006.01) |
| *C01B 32/25* | (2017.01) |

(Continued)

(52) U.S. Cl.
CPC ............ *C01B 32/28* (2017.08); *C01B 32/25* (2017.08); *C01B 32/26* (2017.08); *C23C 16/26* (2013.01);
(Continued)

(58) Field of Classification Search
CPC ......... C01B 32/25; C01B 32/26; C01B 32/28; C23C 16/26; C23C 16/505;
(Continued)

(56) References Cited

U.S. PATENT DOCUMENTS

| 8,105,660 B2 | 1/2012 | Tudhope et al. |
| 8,669,181 B1 * | 3/2014 | Yu ................... H01L 21/02115 |
| | | 257/E21.582 |

(Continued)

FOREIGN PATENT DOCUMENTS

KR   20110115291 A   10/2011

OTHER PUBLICATIONS

International Search Report and Written Opinion in PCT/US2018/032684 dated Sep. 5, 2018, 11 pages.

(Continued)

*Primary Examiner* — Mohammed Shamsuzzaman
(74) *Attorney, Agent, or Firm* — Servilla Whitney LLC (57) ABSTRACT

A method of fabricating a semiconductor structure is described. The method comprises forming at least one mandrel on a substrate, the at least one mandrel comprising a diamond-like carbon and having a top and two opposing sidewalls, the diamond-like carbon comprising at least 40% $sp^3$ hybridized carbon atoms. The mandrel may be used in Self-Aligned Multiple Patterning (SAMP) processes.

10 Claims, 4 Drawing Sheets

(51) Int. Cl.
*H01L 21/033* (2006.01)
*C23C 16/26* (2006.01)
*C23C 16/505* (2006.01)

(52) U.S. Cl.
CPC ...... *C23C 16/505* (2013.01); *H01L 21/02115* (2013.01); *H01L 21/02205* (2013.01); *H01L 21/02271* (2013.01); *H01L 21/02274* (2013.01); *H01L 21/0332* (2013.01); *H01L 21/3081* (2013.01); *H01L 21/3086* (2013.01); *H01L 21/31111* (2013.01); *H01L 21/31144* (2013.01)

(58) Field of Classification Search
CPC ......... H01L 21/02115; H01L 21/02205; H01L 21/02271; H01L 21/02274; H01L 21/0332; H01L 21/3081; H01L 21/3086; H01L 21/31111; H01L 21/31144
See application file for complete search history.

(56) References Cited

U.S. PATENT DOCUMENTS

| | | |
|---|---|---|
| 2004/0013971 A1 | 1/2004 | Berger et al. |
| 2005/0100814 A1 | 5/2005 | Berger et al. |
| 2006/0264063 A1 | 11/2006 | Stern et al. |
| 2008/0226841 A1 | 9/2008 | Ravi |
| 2009/0029067 A1 | 1/2009 | Sciamanna et al. |
| 2009/0075203 A1 | 3/2009 | Liu et al. |
| 2009/0176035 A1 | 7/2009 | Tudhope et al. |
| 2009/0186206 A1* | 7/2009 | Ito ............ C23C 14/0605 428/216 |
| 2011/0190544 A1* | 8/2011 | Navarrini .......... C01B 32/15 568/591 |
| 2012/0276743 A1 | 11/2012 | Won et al. |
| 2015/0099367 A1* | 4/2015 | Kim ............ H01L 21/31116 438/715 |
| 2015/0371851 A1* | 12/2015 | Lee ............ H01J 37/32091 438/694 |
| 2016/0179005 A1 | 6/2016 | Shamma et al. |
| 2017/0231086 A1* | 8/2017 | Kreutzwiesner ..... H05K 3/4602 |
| 2018/0240667 A1* | 8/2018 | Yu ............ H01L 21/0332 |

OTHER PUBLICATIONS

Non-Final Office Action in U.S. Appl. No. 16/002,222 dated Jun. 6, 2019, 13 pages.

Final Office Action in U.S. Appl. No. 16/002,222 dated Feb. 19, 2020, 15 pages.

* cited by examiner

DIAMOND-LIKE CARBON AS MANDREL

CROSS-REFERENCE TO RELATED APPLICATIONS

This application claims priority to U.S. Provisional Application No. 62/516,828, filed Jun. 8, 2017, and to U.S. Provisional Application No. 62/546,266, filed Aug. 16, 2017, the entire disclosures of which are hereby incorporated by reference.

TECHNICAL FIELD

Embodiments of the present disclosure generally relate to fabrication of semiconductors, including depositing high-density diamond-like carbon films. More particularly, embodiments of the disclosure are directed to using a high-density carbon film as a mandrel in multiple patterning applications.

BACKGROUND

Multiple patterning is being used by the semiconductor industry to build smaller structures with each advancing node in both logic and memory. Self-aligned quadruple patterning (SAQP) and higher schemes require at least five materials for multi-color patterning. The materials have inherent selectivity with respect to each other for etching. Currently, schemes that use oxide, nitride, amorphous silicon, and several different hard masks are being used.

New materials having better selectivity with respect to the other materials used in the multi-color patterning scheme are required going forward to 5 nm node and smaller semiconductor processes. Additionally, currently available mandrel materials do not provide the required strip selectivity against spin-on-carbon (SOC). New materials, therefore, not only require etch selectivity with respect to the other materials used in the multi-patterning approach but also strip selectivity.

Therefore, there is a need for materials used in multiple patterning processes that have high degrees of both etch selectivity and strip selectivity.

SUMMARY

Apparatuses and methods to manufacture integrated circuits are described. In one or more embodiments, a method of fabricating a semiconductor structure is described. In one or more embodiment, at least one mandrel is formed on a substrate. The at least one mandrel comprising a diamond-like carbon and having a top surface and two opposing sidewalls. The diamond-like carbon comprises at 40% $sp^3$ hybridized carbon atoms.

One or more embodiments provide a method of patterning a substrate. In one or more embodiment, at least one mandrel is formed on a silicon-containing layer formed on a titanium nitride layer. The at least one mandrel comprises a diamond-like carbon and has a top surface and two opposing sidewalls. The diamond-like carbon comprises greater than 40 percent $sp^3$ hybridized carbon atoms. At least one layer of a spacer film is deposited on the at least one mandrel. The spacer film is etched from the top surface of the at least one mandrel, leaving the spacer film on the two opposing sidewalls of the at least one mandrel. The at least one mandrel is removed to leave the spacer film from the two opposing sidewalls of the at least one mandrel and expose portions of the silicon-containing layer. The exposed portions of the silicon-containing layer are etched to form adjacent pairs of substrate features.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

Plasma enhanced chemical vapor deposition (PECVD) is widely used to deposit amorphous carbon films due to cost efficiency and film property versatility. In a PECVD process, a hydrocarbon source, such as a gas-phase hydrocarbon or vapors of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired amorphous carbon film thereon. Embodiments described herein in reference to a PECVD process can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. Any apparatus description described herein is illustrative and should not be construed or interpreted as limiting the scope of the implementations described herein.

Self-aligned multiple patterning (SAMP) techniques (such as self-aligned double patterning (SADP) or self-aligned quadruple patterning (SAQP), and higher patterning), are currently used in ultra-high density integrated circuits to provide an electrical interconnection system which includes multiple arrays of parallel metal lines disposed in several levels of dielectric layers within a semiconductor structure. The dielectric layers are typically interconnected through a system of metalized vias.

In such SAMP techniques, the metal lines are typically formed from a series of self-aligned mandrel spacers disposed on sidewalls of parallel mandrels within the semiconductor structure. During the process flow, the mandrels are pulled to form a pattern from the remaining self-aligned mandrel spacers. The pattern is then transferred down into the underlying layers of the semiconductor structure to ultimately form alternating parallel mandrel and non-mandrel metal lines in a dielectric layer.

In an SADP technique, this basic process is performed once during the formation of the metal lines, such that the pitch of the metal lines is half the pitch of the mandrels. In an SAQP technique, this basic process is performed twice during the formation of the metal lines, such that the pitch of the metal lines is a quarter the pitch of the mandrels.

Figure 1A:
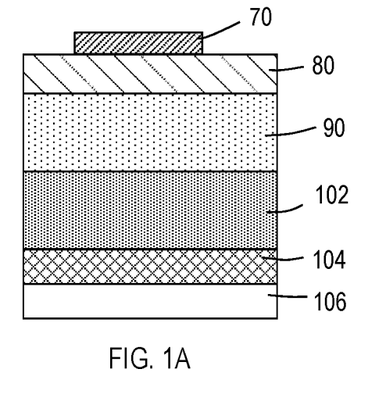
FIGS. 1A through 1C show cross-sectional views of a process to form a mandrel for use with a self-aligned multiple patterning process according to one or more embodiments of the disclosure.
Figure 1B:
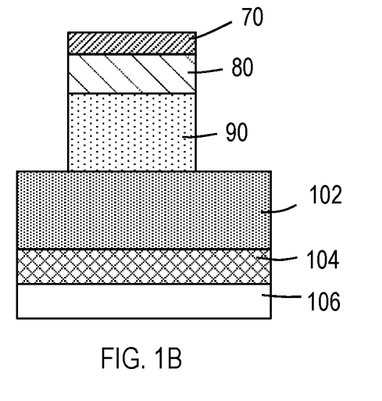
Figure 1C:
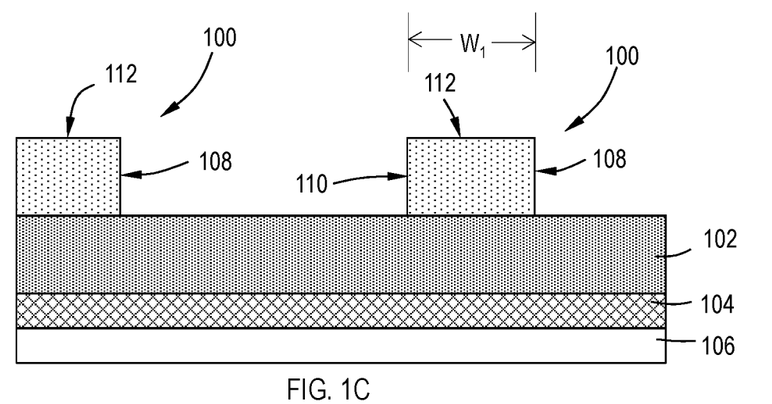

FIG. 1A illustrates a film stack comprising substrates 102, 104, 106 with a pre-mandrel material 90. In one or more embodiment, the pre-mandrel material 90 may be formed by pulsed plasma enhanced chemical vapor deposition (PECVD). A barrier layer 80 is formed on top of the pre-mandrel material 90. In some embodiments, the barrier layer 80 comprises spin-on-carbon (SOC). A mask layer 70 is formed on the barrier layer 80. The mask layer 70 can be formed by any suitable process known to the skilled artisan including, but not limited, lithography. FIG. 1B illustrates the film stack of FIG. 1A after removal of the barrier layer 80 and pre-mandrel material 90 that is not covered by the mask layer 70. In FIG. 1C, a larger portion of the film stack of FIG. 1B is illustrated after removal of the mask layer 70 and barrier layer 80. At this point, the pre-mandrel material 90 is considered at least one mandrel 100.

Referring to FIG. 1C, one or more embodiment provides a method of fabricating a semiconductor structure. Referring to FIG. 1C, at least one mandrel 100 is formed on a substrate 102. In some embodiments, the substrate 102 may be formed on a second substrate 104. There may be one or more additional substrate 106. The at least one mandrel 100 has a top surface 112 and two sidewalls 108, 110. In one or more embodiment, the width, $W_1$, of the at least one mandrel 100 is the distance between sidewall 108 and sidewall 110. The embodiment shown in FIG. 1C includes a complete mandrel 100 on the right and a partial mandrel on the left. The partial mandrel only shows sidewall 108, while sidewall 110 is outside of the boundary of the drawing. For convenience of description, only one full mandrel and a partial mandrel are shown in cross-section. However, it will be understood by those skilled in the art that there can be many mandrels present on a substrate and that the scope of the disclosure is not limited to the embodiment shown.

In one or more embodiment, the at least one mandrel 100 comprises a diamond-like carbon material. Current mandrel applications for memory and other devices largely make use of thick silicon films (e.g., 300 nanometers to 1.5 microns). The removal of current mandrel films leaves undesirable by-products (e.g. $SiF_4$ and other fluorides that are damaging to the other exposed layers). In one or more embodiments, the diamond-like carbon material that comprises mandrel 100 has high etch selectivity and also is easily removable post patterning. In one or more embodiments, to achieve greater etch selectivity, the density and, more importantly, the Young's modulus of the mandrel film needs to be improved. One of the main challenges in achieving greater etch selectivity and improved Young's modulus is the high compressive stress of such a film making it unsuitable for applications owing to the resultant high wafer bow. Hence, there is a need for carbon (diamond-like) films with high-density and modulus (e.g., higher $sp^3$ content, more diamond-like) with high etch selectivity along with low stress (e.g., <−500 MPa).

Embodiments described herein, include improved methods of fabricating mandrels with high-density (e.g., >1.8 g/cc), high Young's elastic modulus (e.g., >150 GPa), and low stress (e.g., <−500 MPa). In one or more embodiments, the Young's modulus is measured at room temperature, or at ambient temperature, or at a temperature in the range of from about 22° C. to about 25° C. In one or more embodiment, Young's modulus of the diamond-like carbon may be greater than 150 GPa, including greater than 160 GPa, greater than 170 GPa, greater than 180 GPa, greater than 190 GPa, greater than 200 GPa, greater than 210 GPa, greater than 220 GPa, greater than 230 GPa, greater than 240 GPa, and greater than 250 GPa. In one or more embodiment, Young's modulus of the diamond-like carbon may be greater than 200 GPa. The carbon films fabricated according to the embodiments described herein are amorphous in nature and have a higher etch selectivity with much greater modulus (e.g., >150 GPa) along with lower stress (<−500 MPa) than current patterning films. In one or more embodiment, the stress is less than −500 MPa. In one or more embodiment, the stress is about −250 MPa. In one or more embodiment, the stress is in a range of about −250 MPa to less than about −500 MPa. In one or more embodiment, the stress is less than about −250 MPa.

In one or more embodiment, the density of the diamond-like carbon is greater than 1.8 g/cc, including greater than 1.9 g/cc, and greater than 2.0 g/cc. In one or more embodiment, the density of the diamond-like carbon is about 2.1 g/cc. In one or more embodiment, the density of the diamond-like carbon is in a range of about greater than 1.8 g/cc to about 2.2 g/cc. In one or more embodiment, the density of the diamond-like carbon is greater than about 2.2 g/cc.

The diamond-like carbon films fabricated according to the embodiments described herein not only have a low stress but also have a high $sp^3$ carbon content.

In some embodiments, the diamond-like carbon films described herein may be formed by chemical vapor deposition (plasma enhanced and/or thermal) processes using hydrocarbon-containing gas mixtures including precursors such as but not limited to $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), or combinations thereof. The deposition process may be carried out at temperatures ranging from −50 degrees Celsius to 600 degrees Celsius. The deposition process may be carried out at pressures ranging from 0.1 mTorr to 10 Torr in a processing volume. The hydrocarbon-containing gas mixture may further include any one of, or a combination of any of He, Ar, Xe, $N_2$, $H_2$. The hydrocarbon-containing gas mixture may further include etchant gases such as $Cl_2$, $CF_4$, $NF_3$ to improve film quality. The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of diamond-like carbon for use as a mandrel. The high etch selectivity of the diamond-like carbon film is achieved by having higher density and modulus than current generation films. Not to be bound by theory but it is believed that the higher density and modulus are a result of the high content of $sp^3$ hybridized carbon atoms in the film, which in turn may be achieved by a combination of low pressure and plasma power.

In some embodiments, hydrogen radical are fed through an RPS, which leads to selective etching of $sp^2$ hybridized carbon atoms thereby increasing the $sp^3$ hybridized carbon atom fraction of the film further, thus further increasing the etch selectivity.

The quantity/percentage of $sp^3$ hybridized carbon atoms in the as deposited diamond-like carbon may vary from application to application. In various embodiments of the present disclosure, the as-deposited diamond-like carbon film may contain at least 40, 45, 50, 55, 60, 65, 70, 75, 80, or 85 percent of sp3 hybridized carbon atoms. The as-deposited diamond-like carbon film may contain up to 45, 50, 55, 60, 65, 70, 75, 80, 85, or 90 percent of sp3 hybridized carbon atoms. The as-deposited diamond-like carbon film may contain from about 50 to about 90 percent of $sp^3$ hybridized carbon atoms. The as-deposited diamond-like carbon film may contain from about 60 to about 70 percent of $sp^3$ hybridized carbon atoms.

In one or more embodiments, the high-density diamond-like carbon film with high $sp^3$ content, which is used as a mandrel in multiple patterning applications, shows good etch selectivity versus oxide/nitride and also excellent strip selectivity versus existing hard masks and spin-on-carbon (SOC).

In one or more embodiment, the mandrel that is composed of a diamond-like carbon material comprising greater than 40 percent $sp^3$ hybridized carbon atoms may be used in self-aligned multiple patterning (SAMP) techniques (such as self-aligned double patterning (SADP) or self-aligned quadruple patterning (SAQP), and higher patterning). Such a self-aligned multiple patterning (SAMP) process is exemplified in FIGS. 1-12. It will be understood by those skilled in the art, however, that there can be various different patterning processes where a mandrel composed of a diamond-like carbon material comprising greater than 40 percent $sp^3$ hybridized carbon atoms may be used, and that the scope of the disclosure is not limited to the embodiments shown. Referring to FIGS. 1-12, at least one mandrel 100 is formed on a silicon-containing layer substrate 102 formed on a titanium nitride layer second substrate 104. The titanium nitride layer may be formed on an additional substrate 106.

Referring to FIG. 1C, the term "mandrel" is used to describe the photoresist feature 100 shown in FIGS. 1-12. The at least one mandrel 100 includes a top surface 112 and sidewalls 108, 110. The width $W_1$ of the at least one mandrel 100 is defined as the distance between the sidewalls 108, 110. The embodiment shown in FIGS. 1-10 includes a complete mandrel 100 on the right and a partial mandrel on the left. The partial mandrel only shows sidewall 108, while sidewall 110 is outside of the boundary of the drawing. For convenience of description, only one full mandrel and a partial mandrel are shown in cross-section. However, it will be understood by those skilled in the art that there can be many mandrels present on a substrate and that the scope of the disclosure is not limited to the embodiment shown.

Figure 2:
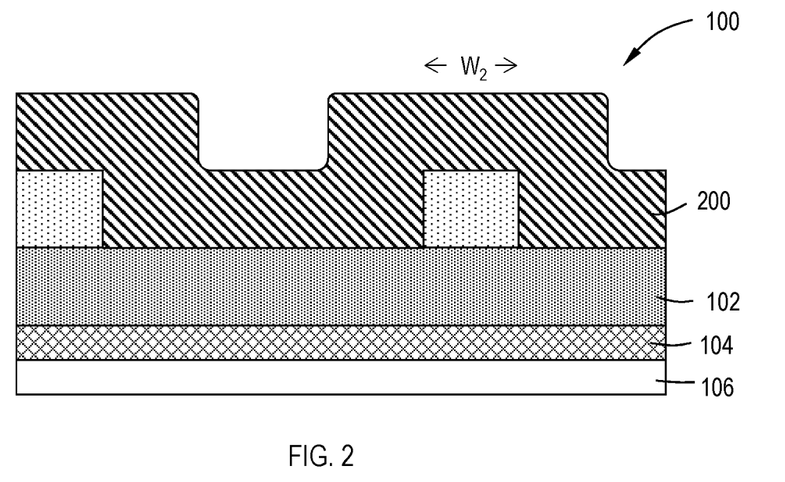
FIG. 2 shows a cross-sectional view of a stage in a self-aligned multiple patterning process after formation of a spacer film according to one or more embodiments of the disclosure.

As shown in FIG. 2, a spacer film 200 is deposited over the substrate 102 and the at least one mandrel 100. The spacer film 200 can form a film which conforms to the shape of the substrate 102 surface including the at least one mandrel 100. Deposition of the spacer film 200 may result in damage to the at least one mandrel 100 causing a decrease in the height and width of the mandrel. The width $W_2$ of the at least one mandrel 100 shown in FIG. 2 is smaller than the width $W_1$ shown in FIG. 1C as a result of the damage. In some embodiments, the width $W_1$ of the mandrel remains substantially unchanged upon formation of the spacer film 200. In some embodiments, the at least one mandrel 100 is thinned by a suitable process known to skilled artisan (e.g., plasma exposure) prior formation of the spacer film 200.

The spacer film 200 can have any suitable composition and can be deposited by any suitable technique. In one or more embodiments, the spacer film 200 comprised of spin-on-carbon (SOC). In some embodiments, the spacer film 200 comprises silicon oxide. In some embodiments the spacer film 200 is deposited by ALD or plasma enhanced atomic layer deposition (PE ALD). In a PE ALD process, the substrate 102, and any features, e.g. at least one mandrel 100, thereon, is exposed to a first reactive gas followed by exposure to a second reactive gas comprising a plasma. In some embodiments, the first reactive gas comprises a silicon precursor and the second reactive gas comprises a plasma comprising molecular and/or atomic oxygen (e.g., $O_2$, $O_3$, $H_2O_2$).

The spacer film 200 is deposited to create a layer having a total thickness of less than about 50 nm. In some embodiments, the total thickness of the spacer film 200 is less than about 45 nm, or less than about 40 nm, or less than about 35 nm, or less than about 30 nm, or less than about 25 nm, or less than about 20 nm. In one or more embodiments, the total thickness of the spacer film 302 is in the range of about 15 nm to about 40 nm, or in the range of about 20 nm to about 30 nm.

Figure 3:
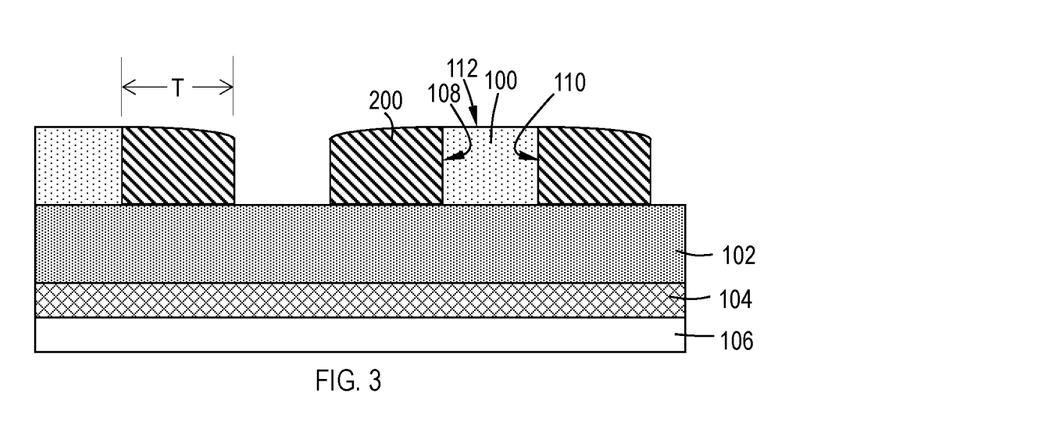
FIG. 3 shows a cross-sectional view of a stage in a self-aligned multiple patterning process after etching according to one or more embodiments of the disclosure.

Referring to FIG. 3, after the spacer film 200 has been deposited to the predetermined thickness, the spacer film 200 is etched. FIG. 3 shows the results of the etching process. Etching removes the spacer material from the top surface 112 of the at least one mandrel, leaving the spacer material on the sidewalls 108, 110 of the mandrel 100. Stated differently, etching removes substantially all of the spacer film 200 from the top 112 of the at least one mandrel 100 and without removing substantially any of the spacer film 200 from the sidewalls 108, 110. As used in this specification and the appended claims, the term "substantially all" when referring to the removal of the spacer film from the top surface of the mandrel means that at least about 98% of the material on the surface has been removed. As used in this specification and the appended claims, the term "not removing substantially any" when referring to the removal of the spacer film from the sidewalls of the mandrel means that the thickness T of the spacer film on the mandrel is reduced by no more than about 10%, or 5%, or 2%, or 1%.

Figure 4:
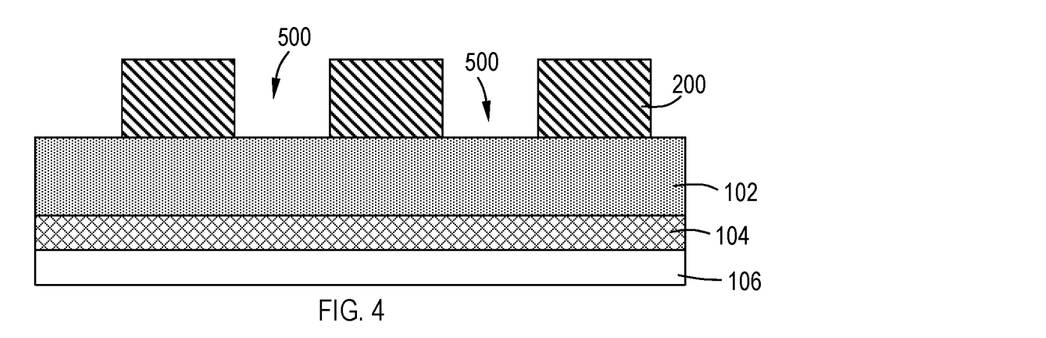
FIG. 4 shows a cross-sectional view of a stage in a self-aligned multiple patterning process after removal of the mandrels according to one or more embodiments of the disclosure.

Referring to FIG. 4, the at least one mandrel 100 has been removed, leaving the spacer film 200 that was adjacent to the sidewalls 108, 110 of the at least one mandrel 100. With the at least one mandrel removed, exposed portions 500 of the substrate 102 become accessible.

Figure 5:
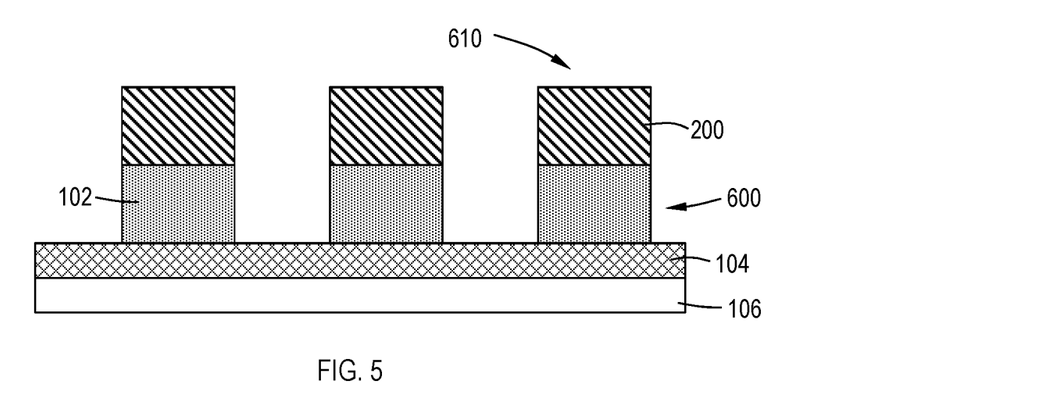
FIG. 5 shows a cross-sectional view of a stage in a self-aligned multiple patterning process after etching the first substrate according to one or more embodiments of the disclosure.
Figure 6:
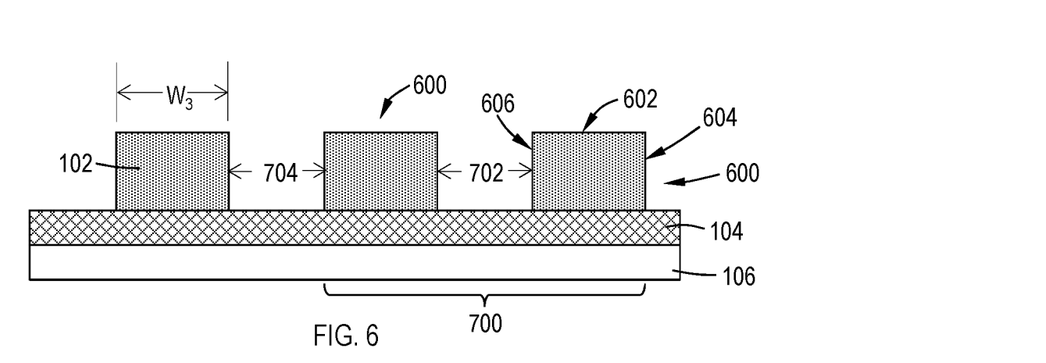
FIG. 6 shows a cross-sectional view of a stage in a self-aligned multiple patterning process after removal of the spacer film according to one or more embodiments of the disclosure.

In FIG. 5, the exposed portions 500 of the substrate 102 are etched to produce additional features on the substrate 102, referred to as substrate features 600. In one or more embodiment, depending upon the composition of the substrate 102 material, substrate features 600 may be mandrels composed of the diamond-like carbon comprising at least 40% $sp^3$ hybridized carbon atoms described herein. In one or more embodiment, the diamond-like carbon comprises about 60% $sp^3$ hybridized carbon atoms. Referring to FIGS. 5 and 6, the exposed portions 610 of the substrate 102 and the spacer film 200 are etched to produce additional features on the substrate. The features formed in FIGS. 5 and 6 are referred to as substrate features 600 to distinguished over the at least one mandrel 100. In some embodiments, the process proceeds from FIGS. 4 to 6 in a single process. In some embodiments, the process proceeds from FIGS. 4 to 5 to 6 in sequential processes.

Figure 7:
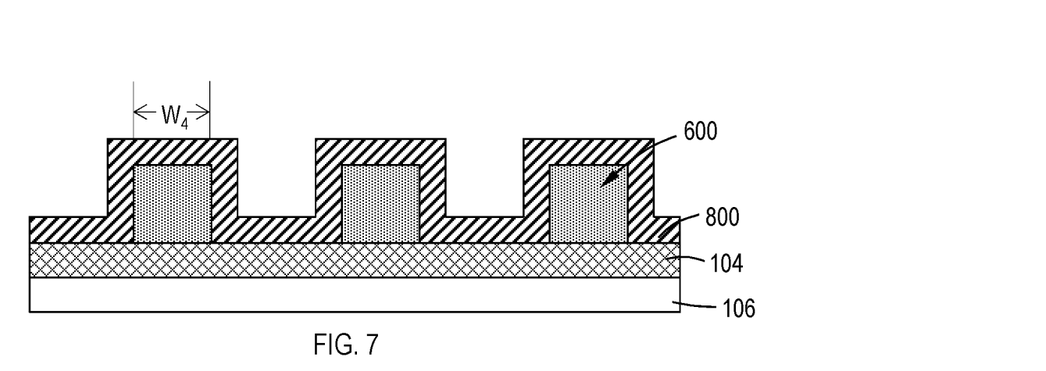
FIG. 7 shows a cross-sectional view of a stage in a self-aligned multiple patterning process after formation of a second spacer film according to one or more embodiments of the disclosure.

At this point, every at least one mandrel 100 from FIG. 1C has been doubled into substrate features 600 in FIG. 6. The process up to this point is often referred to as Self-Aligned Double Patterning (SADP). The substrate features 600 formed have a top surface 602, sidewalls 604, 606 and a width $W_3$. The embodiment in FIG. 7 shows 1½ pairs of adjacent substrate features 600. The middle and right feature form a pair 700 and the left feature is one half of the adjacent pair of features.

The substrate features 600 formed are described as having two critical dimensions (CD); a pair critical dimension and an adjacent critical dimension. The pair critical dimension 702 is defined as the distance between each of the substrate features 600 in the pair 700. The adjacent critical dimension 704 is defined as the distance between the substrate features of an adjacent pair. In one or more embodiments, the ratio of the adjacent critical dimension 704 to the pair critical dimension 702 is in the range of about 0.9:1 to about 1:0.9, or in the range of about 0.95:1 to about 1:0.95 or about 1:1. The difference between the pair critical dimension 702 and the adjacent critical dimension 704 of some embodiments is in the range of about −1.5 nm to about 1.5 nm, or in the range of about −1 nm to about 1 nm. In some embodiments, the absolute value of the difference between the pair critical dimension 702 and the adjacent critical dimension 704 is less than or equal to about 1.5 nm, or 1.4 nm, or 1.3 nm, or 1.2 nm, or 1.1 nm, or 1.0 nm.

The substrate features 600 have a top 602 and sidewalls 604, 606. The width $W_3$ of the substrate feature 600 is defined as the distance between the sidewalls 604, 606. As shown in FIG. 7, a second spacer film 800 is deposited over the second substrate 104 and first substrate features 600. The spacer film 800 can form a film which conforms to the shape of the second substrate 104 surface including the substrate features 600. Deposition of the spacer film 800 results in damage to the substrate features 600 causing a decrease in the height and width of the features. The width $W_4$ of substrate feature 600 shown in FIG. 7 is smaller than the width $W_3$ shown in FIG. 6 as a result of the damage. In some embodiments, the width $W_3$ of the features 600 remain substantially the same during formation of the spacer film 800. As used in this specification and the appended claims, the term "substantially the same" means that the width of the feature does not change by more than 5%, 2%, 1% or 0.5%. In some embodiments, the features 600 are trimmed by any suitable process to decrease the width of the features 600 prior to formation of the spacer film 800.

The second spacer film 800 can have any suitable composition and can be deposited by any suitable technique. In some embodiments the second spacer film 800 and features thereon are exposed to a third reactive gas followed by exposure to a fourth reactive gas. In some embodiments, the fourth reactive gas comprises a plasma. In some embodiments, the third reactive gas comprises a silicon precursor and the fourth reactive gas comprises a plasma comprising molecular and/or atomic oxygen (e.g., $O_2$, $O_3$, $H_2O_2$).

The second spacer film 800 is deposited to create a layer having a total thickness of less than about 50 nm. In some embodiments, the total thickness of the second spacer film 900 is less than about 45 nm, or less than about 40 nm, or less than about 35 nm, or less than about 30 nm, or less than about 25 nm, or less than about 20 nm. In one or more embodiments, the total thickness of the second spacer film 900 is in the range of about 15 nm to about 40 nm, or in the range of about 20 nm to about 30 nm.

The second spacer film 800 of some embodiments comprises silicon oxide. The silicon oxide can be deposited by sequential exposure of the substrate a silicon precursor and a plasma. The silicon precursor can be any suitable silicon precursors including, but not limited to, silicon halides and organosilicates. The plasma of some embodiments comprises one or more of oxygen, ozone, ammonia, nitrogen or peroxide.

Figure 8:
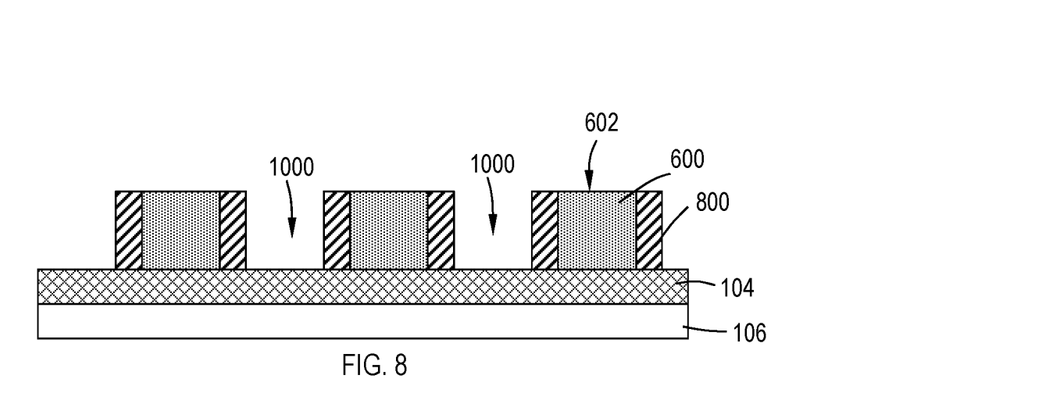
FIG. 8 shows a cross-sectional view of a stage in a self-aligned multiple patterning process after etching according to one or more embodiments of the disclosure.

After the second spacer film 800 has been deposited to the predetermined thickness, the second spacer film 800 is etched. FIG. 8 shows the results of the etching process. Etching removes the spacer material from the top surface 602 of the substrate features 600 leaving the second spacer film 800 on the sidewalls 604, 606 of the substrate feature 600. Stated differently, etching removes substantially all of the second spacer film 800 from the top surface 602 of the substrate feature 600 and without removing substantially any of the second spacer film from the sidewalls 604, 606. After etching, exposed portions 1000 of the second substrate 104 become accessible.

Figure 9:
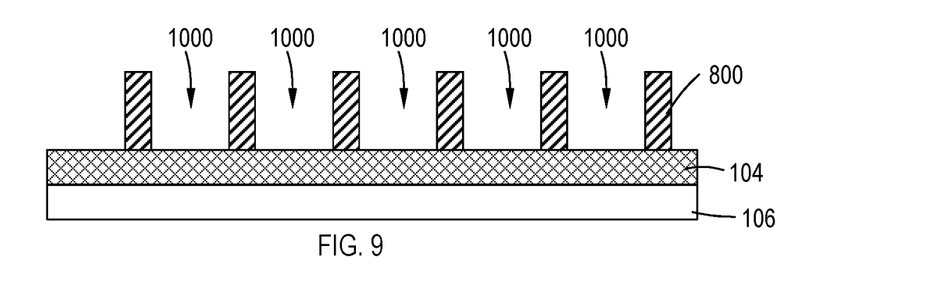
FIG. 9 shows a cross-sectional view of a stage in a self-aligned multiple patterning process after removal of the first substrate according to one or more embodiments of the disclosure.

Referring to FIG. 9, the substrate features 600 have been removed, leaving the second spacer film 800 that was adjacent to the sidewalls 604, 606 of the substrate features 600. With the substrate features 600 removed, additional exposed portions 1000 of the second substrate 104 become accessible.

Figure 10:
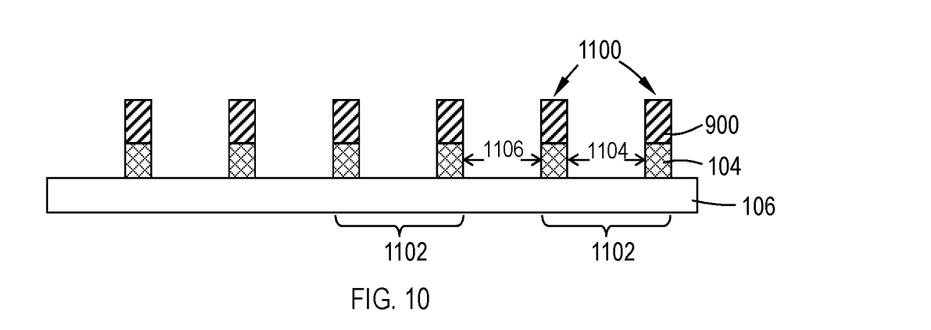
FIG. 10 shows a cross-sectional view of a stage in a self-aligned multiple patterning process after etching the second substrate according to one or more embodiments of the disclosure.

In FIG. 10, the exposed portions 1000 of the second substrate 104 are etched to produce additional features on the substrate, referred to as second features 1100. In one or more embodiment, depending upon the composition of the second substrate 104 material, second features 1100 may be mandrels composed of the diamond-like carbon comprising at least 40% $sp^3$ hybridized carbon atoms described herein. In one or more embodiment, the diamond-like carbon comprises about 60% $sp^3$ hybridized carbon atoms. In the embodiment shown in FIG. 12, the second features 1100 have small amounts of second spacer film 900 thereon. In some embodiments, the second features 1100 have little or no second spacer film 900 thereon.

At this point, every at least one mandrel 100 from FIG. 1C has been quadrupled into second features 1100 in FIG. 10. The process up to this point is often referred to as Self-Aligned Quadruple Patterning (SAQP).

The second features 1100 formed are paired 1102 and can be described as having two critical dimensions (CD); a pair critical dimension 1104 and an adjacent critical dimension 1106. The pair critical dimension 1104 is defined as the distance between each of the second features 1100 in the pair 1102. The adjacent critical dimension 1106 is defined as the distance between the features of an adjacent pair. In one or more embodiments, the ratio of the adjacent critical dimension 1106 to the pair critical dimension 1104 is in the range of about 0.9:1 to about 1:0.9, or in the range of about 0.95:1 to about 1:0.95 or about 1:1. The difference between the pair critical dimension 1104 and the adjacent critical dimension 1106 of some embodiments is in the range of about −1.5 nm to about 1.5 nm, or in the range of about −1 nm to about 1 nm. In some embodiments, the absolute value of the difference between the pair critical dimension 1104 and the adjacent critical dimension 1106 is less than or equal to about 1.5 nm, or 1.4 nm, or 1.3 nm, or 1.2 nm, or 1.1 nm, or 1.0 nm.

As will be appreciated by those of skill in the art, various features disclosed in the patterning process of FIGS. 1-10 may result in the formation of a mandrel on a substrate. Accordingly, various features disclosed in FIGS. 1-10 may comprise the diamond-like carbon comprising at least 40% $sp^3$ hybridized carbon atoms of one or more embodiments. For example, referring to FIGS. 1-12, in one or more embodiment, the mandrel 100 may comprise a diamond-like carbon comprising at least 40% $sp^3$ hybridized carbon atoms. In other embodiments, the substrate 102 may comprise a diamond-like carbon comprising at least 40% $sp^3$ hybridized carbon atoms. In another embodiment, one or more of the spacer film 200, the spacer film 800, the spacer film 900, or the spacer film 902 may comprise a diamond-like carbon comprising at least 40% $sp^3$ hybridized carbon atoms. In still further embodiments, the substrate 104 may comprise a diamond-like carbon comprising at least 40% $sp^3$ hybridized carbon atoms. In some embodiments, the mandrel 100 and second substrate 104 comprise a diamond-like carbon comprising at least 40% $sp^3$ hybridized carbon atoms and the first substrate 102 is etch selective to the diamond-like carbon. In some embodiments, the first substrate 102 comprises diamond-like carbon comprising at least 40% $sp^3$ hybridized carbon atoms and the mandrel 100 and second substrate 104 are etch selective to the diamond-like carbon. As used in this specification and the appended claims, the term "etch selective" means that the subject film is etched at a rate greater than or equal to about 20, 30, 40 or 50 times that of adjacent materials.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method of fabricating a semiconductor structure, the method comprising:
    forming a film stack on a substrate by plasma enhanced chemical vapor deposition (PECYD) at a temperature ranging from −50° C. to 600° C. and a pressure ranging from 0.1 mTorr to 10 Torr, the film stack comprising a pre-mandrel material;
    forming a barrier layer on a top surface of the pre-mandrel material, the bather layer comprising spin-on-carbon;
    forming a mask layer on a portion of a top surface of the barrier layer;
    removing the barrier layer and pre-mandrel material that is not covered by the mask layer;
    removing the mask layer and the barrier layer that is covered by the mask layer to form at least one mandrel on a silicon-containing layer formed on a titanium nitride layer on the substrate, the at least one mandrel comprising a diamond-like carbon and having a top surface and two opposing sidewalls, the diamond-like carbon comprising at least 40% spa hybridized carbon atoms;
    depositing at least one layer of a spacer film on the at least one mandrel;
    etching the spacer film from the top surface of the at least one mandrel leaving the spacer film on the two opposing sidewalls of the at least one mandrel;
    removing the at least one mandrel to leave the spacer film from the two opposing sidewalls of the at least one mandrel and expose portions of the silicon-containing layer; and
    etching the exposed portions of the silicon-containing layer to form adjacent pairs of substrate features.

2. The method of claim 1, wherein the diamond-like carbon is etch selective and strip selective over spin-on-carbon (SOC).

3. The method of claim 1, wherein the diamond-like carbon has a stress less than −500 MPa.

4. The method of claim 1, wherein the diamond-like carbon has a density greater than 1.8 g/cc.

5. The method of claim 1, wherein the diamond-like carbon comprises from about 50% to about 90% $sp^3$ hybridized carbon atoms.

6. The method of claim 1, wherein the diamond-like carbon comprises about 60% $sp^3$ hybridized carbon atoms.

7. The method of claim 1, wherein the diamond-like carbon has a Young's modulus greater than 150 GPa, measured at room temperature.

8. The method of claim 1, wherein the at least one mandrel is formed by pulsed plasma enhanced chemical vapor deposition (PECVD).

9. The method of claim 1, wherein the spacer film comprises silicon oxide.

10. The method of claim 1, wherein the spacer film is a bather layer comprising spin-on-carbon (SOC).

\* \* \* \* \*

UNITED STATES PATENT AND TRADEMARK OFFICE
CERTIFICATE OF CORRECTION

PATENT NO. : 10,954,129 B2  
APPLICATION NO. : 16/002218  
DATED : March 23, 2021  
INVENTOR(S) : Koshizawa et al.

Page 1 of 1

It is certified that error appears in the above-identified patent and that said Letters Patent is hereby corrected as shown below:

In the Claims

Column 10, Claim 1, Line 34, replace "bather" with "barrier".

Column 10, Claim 1, Line 45, replace "40% spa" with "40% sp$^3$".

Column 11, Claim 10, Line 12, replace "bather" with "barrier".

Signed and Sealed this  
Eighteenth Day of May, 2021

Drew Hirshfeld  
*Performing the Functions and Duties of the*  
*Under Secretary of Commerce for Intellectual Property and*  
*Director of the United States Patent and Trademark Office*